United States Patent
Dupont et al.

(10) Patent No.: US 12,037,527 B2
(45) Date of Patent: Jul. 16, 2024

(54) METHOD TO PREPARE SURFACE STABILIZED QUANTUM DOTS AND SURFACE STABILIZED QUANTUM DOTS RESULTING FROM SUCH METHOD

(71) Applicant: QustomDot B.V., Ghent (BE)

(72) Inventors: Dorian Dupont, Ghent (BE); Zeger Hens, Ghent (BE); Mickael Tessier, Ghent (BE)

(73) Assignee: QustomDot B.V., Ghent (BE)

( * ) Notice: Subject to any disclaimer, the term of this patent is extended or adjusted under 35 U.S.C. 154(b) by 0 days.

(21) Appl. No.: 17/753,060

(22) PCT Filed: Aug. 31, 2020

(86) PCT No.: PCT/EP2020/074213
§ 371 (c)(1),
(2) Date: Feb. 17, 2022

(87) PCT Pub. No.: WO2021/038100
PCT Pub. Date: Mar. 4, 2021

(65) Prior Publication Data
US 2022/0306934 A1  Sep. 29, 2022

(30) Foreign Application Priority Data
Aug. 30, 2019 (EP) .................... 19194675

(51) Int. Cl.
*C09K 11/02* (2006.01)
*C09K 11/70* (2006.01)
*C09K 11/88* (2006.01)
*H01L 33/50* (2010.01)

(52) U.S. Cl.
CPC ............ *C09K 11/025* (2013.01); *C09K 11/70* (2013.01); *C09K 11/883* (2013.01); *H01L 33/502* (2013.01); *H01L 2933/0041* (2013.01)

(58) Field of Classification Search
CPC ..... C09K 11/025; C09K 11/70; C09K 11/883; H01L 33/502; H01L 2933/0041
See application file for complete search history.

(56) References Cited

U.S. PATENT DOCUMENTS

2018/0102449 A1   4/2018   Pschenitzka et al.

FOREIGN PATENT DOCUMENTS

| EP | 3163372 | * | 5/2017 |
|---|---|---|---|
| EP | 3163372 A2 | | 5/2017 |
| WO | 2017/140489 A1 | | 8/2017 |
| WO | WO 2017/140489 | * | 8/2017 |
| WO | 2017/200824 A1 | | 11/2017 |
| WO | WO 2017/200824 | * | 11/2017 |
| WO | 2018/035948 A1 | | 3/2018 |
| WO | WO 2019/211257 | * | 11/2019 |

OTHER PUBLICATIONS

Lee et al.; "Photo-stable cross-linked micron bead with functionalized quantum via suspension polymerization for color conversion", Polymer, vol. 177, May 24, 2019 (May 24, 2019), pp. 19-24, XP055665929, GB, ISSN: 0032-3861, DOI: 10.1016/j.polymer.2019.05.059.

* cited by examiner

*Primary Examiner* — C Melissa Koslow
(74) *Attorney, Agent, or Firm* — N.V. Nederlandsch Octrooibureau

(57) ABSTRACT

The disclosure relates to a method to prepare surface stabilized quantum dots by dispersing quantum dots having at least a first type of ligands bonded to their surface in a solvent having at least one multifunctional compound. The multifunctional compound includes at least a first functional group and at least a second functional group. The first functional group of the multifunctional compound is able to bind to the outer surface of the quantum dots and the second functional group of the multifunctional compound is able to interact with a first functional group of the first type of ligands provided on the outer surface of the quantum dots. The disclosure further relates to surface stabilized quantum dots obtainable by this method, to articles including such quantum dots and to the use of such quantum dots for use in on-chip color conversion applications.

15 Claims, 8 Drawing Sheets

METHOD TO PREPARE SURFACE STABILIZED QUANTUM DOTS AND SURFACE STABILIZED QUANTUM DOTS RESULTING FROM SUCH METHOD

FIELD OF THE INVENTION

The present invention relates to a method to prepare surface stabilized quantum dots. The invention further relates to surface stabilized quantum dots prepared by such method and to articles comprising such surface stabilized quantum dots.

BACKGROUND ART

Semiconductor nanocrystals or quantum dots (QDs) have attracted wide interest over the last 15 year mainly because of their size-tunable opto-electronic properties and their suitability for solution-based processing. QDs feature a spectrally narrow and tunable photoluminescence, which makes them particularly interesting as photoluminescent color convertor for display, lighting and projection applications.

The first commercial implementations of QDs involved liquid crystal displays (LCD) using a polymer sheet doped with QDs to convert primary blue light in the red-green-blue spectrum needed for additive color mixing. In such application, QDs are implemented as a so-called remote phosphor, which means that the QD-doped polymer sheet is well separated from the primary blue LEDs. An advantage of a remote phosphor approach is that the QDs are exposed to relatively low light intensity and, concomitantly, experience only mild temperature increases. An alternative is to deposit QDs as a color-converting phosphor directly on the blue LED chip. Such an on-chip approach has the advantage that less material is required and offers more design-freedom. The on-chip approach is therefore widely seen as the preferred QD technology, in particular in lighting applications. On-chip QDs are, however, exposed to much higher light intensities and temperatures, leading to stringent photothermal stability requirements.

The first QDs incorporated in LCD displays were QDs comprising cadmium selenide (CdSe), a direct-gap semiconductor having an emission that can be tuned throughout the visible range by changing the size of the CdSe crystallites. A first demonstration of QD-on-chip white LEDs was published in 2017, in which a white light spectrum was generated using a mixture of a powder phosphor (YAG:Ce) and red-emitting CdSe QDs as the color convertor. Because of stringent restrictions on the use of cadmium in consumer products, Cd-based quantum dots are generally considered as ill-suited and a shift from Cd-based quantum dots to Cd-free alternatives such as indium phosphide (InP) QDs has been initiated. At present the photothermal stability of InP-based QDs is insufficient for on-chip color conversion.

Several approaches have been proposed to increase the stability, in particular the photothermal stability of QDs.

A first approach concerns embedding a QD in a shell of a second semiconductor to obtain core/shell QDs. Typical core/shell Cd-based QDs are CdSe/ZnS, CdSe/CdS or multishell structures such as CdSe/CdS/ZnS and more advanced graded composition shells. Typical InP-based core/shell QDs are InP/ZnSe and InP/ZnS and corresponding multishell structures or graded composition structures. It is however widely recognized that shell growth is not sufficient to ensure photothermal stability. For example, the photoluminescence of individual CdSe/ZnS shows intermittent on/off periods, the photoluminescence of the different CdSe-based core/shell QDs suffers from significant reversible an irreversible thermal quenching, and so do InP-based core/shell QDs.

A second approach concerns the embedment of QDs (core or core/shell QDs) in an (additional) inorganic shell, typically a metal oxide such as silicon oxide or aluminium oxide. Such metal oxide shell can be grown as an amorphous material around core/shell QDs to act as a barrier for oxygen and water. While such an approach can be interesting to prevent oxidation, it fails to address intrinsic deficiencies in the QDs, for example due to strain in the core and shell, causing photothermal degradation.

A third approach concerns surface capping engineering. The loss of QD photoluminescence is typically attributed to the formation of defects, so-called trap states, at the QD surface. One can thus expect that adjusting the composition or structure of the surface capping might significantly improve the photothermal stability of a given QD. For example, density functional theory predicts that trap states are related with the presence of under coordinated Se or S at the QD surface, and it has been shown that terminating such surfaces by metal salts that bind to such sites can lead to a close to 100% photoluminescence efficiency.

Another aspect is the dynamic character of the surface capping. At room temperature, ligands may detach from the QD surface or diffuse between different binding sites, thus creating temporary or permanent trap states. In this context, researchers have developed methods to (1) link different QDs together to form QD aggregates and (2) click additional moieties to existing ligands to enhance the chemical functionality of the surface capping. In the latter case, the compounds used and the chemistry reactions they bring about often deteriorate the photoluminescence efficiency.

A fourth approach concerns processing of QD to make QD-in-polymer composites. An example comprises a dispersion of QDs featuring a hydrophobic surface cap in an apolar polymer such as polystyrene. Such an approach has the advantage that the positive impact of the surface capping on the QD photoluminescence can be preserved, while the polymer resin can act as a first oxygen and water barrier. Very often, this leads to multilayer structures in which a first layer of QD-in-polymer composites is sandwiched between high-quality oxygen/moisture-barrier films. An alternative is the formation of a QD-in-polymer composite as the polymerisation product of the QDs and one or more monomers. This again raises the issue of chemical compatibility between the monomers and the QD surface capping, where incommensurate chemistries readily lead to a deterioration of the photoluminescence efficiency. In this respect, three component mixtures have been put forward as a way to combine the formation of a polymerisation product that preserves the photoluminescence efficiency of the QDs and shows enhanced photothermal stability.

SUMMARY OF THE INVENTION

It is an object of the present invention to provide a method to prepare quantum dots, in particular surface stabilized quantum dots, avoiding the drawbacks of the prior art.

It is another object of the present invention to provide a method to prepare surface stabilized quantum dots having a good photothermal stability.

It is another object of the present invention to provide a method that is generic and that can be applied to different types of QDs or nanoparticles.

It is a further object of the present invention to provide surface stabilized quantum dots and an article comprising such surface stabilized QDs.

Furthermore it is an object of the present invention to provide the use of surface stabilized QDs for example for on-chip photoluminescent color conversion applications.

According to a first aspect of the present invention a method to prepare surface stabilized quantum dots is provided. The method comprises the steps of
  a) providing quantum dots having an outer surface, the quantum dots are provided with at least a first type of ligands bonded to the outer surface of the quantum dots and optionally provided with at least a further type of ligands bonded to the outer surface of the quantum dots. The first type of ligands comprises at least one first functional group. Preferably, the at least one first functional group of the first type of ligands remains available once the first type of ligands is bonded to the outer surface of the quantum dots;
  b) providing a reaction mixture by dispersing the quantum dots of step a) in a solvent comprising at least one multifunctional compound. The at least one multifunctional compound comprises at least one first functional group and at least one second functional group. Optionally, the at least one multifunctional compound comprises a further functional group or further functional groups, for example at least a third functional group and/or at least a fourth functional group. The at least one first functional group of the at least one multifunctional compound is able to bind to the outer surface of the quantum dots and the at least one second functional group of the at least one multifunctional compound is able to interact, preferably to cross-link, with the at least one first functional group of the first type of ligands provided on the outer surface of the quantum dots,
  c) preferably, curing said reaction mixture of step b).

Preferably, the reaction mixture of step b) is stirred while dispersing the quantum dots in the solvent and/or once the quantum dots are dispersed in the solvent. The reaction mixture is for example stirred to promote the binding of the multifunctional compound to the outer surface of the quantum dot and/or to promote the interaction, for example the cross-linking, of the second functional group of the multifunctional compound with the first functional group of the first type of ligands.

Optionally, the first functional group of the multifunctional compound is able to bind to the outer surface of the quantum dots and is thereby displacing part of the first type of ligands from the outer surface of the quantum dots. In such case, part of the first type of ligands is displaced and replaced with the multifunctional compound while another part of the first type of ligands remains bonded to the outer surface of the quantum dots.

Preferably, the reaction mixture of step b) is stirred and/or heated to promote a partial exchange of the first type of ligands and the multifunctional compound and/or to promote a partial exchange of the further type of ligands, for example the second type of ligands and/or the third type of ligands.

Optionally, the method comprises a purification step, for example after the partial exchange of the first type of ligands and the multifunctional compound and/or after the partial exchange of the further type of ligands.

Preferably, the solvent is removed from the reaction mixture by any technique known in the art.

As mentioned above, the first type of ligands comprises at least one first functional group remaining available once the first type of ligands is bonded to the outer surface of a quantum dot. In preferred examples the first type of ligands comprises a plurality of first functional groups remaining available once the first type of ligands is bonded to the outer surface of a quantum dot.

Preferably, the at least one functional group of the first type of ligands comprises at least one unsaturated carbon-carbon bond, at least one unsaturated carbon-heteroatom bond, at least one saturated carbon-heteroatom bond or at least one thiol functional group. Examples of functional groups of the first type of ligands comprise amine compounds comprising one or more unsaturated carbon-carbon bond (for example oleylamine), thiol compounds comprising one or more unsaturated carbon-carbon bond or epoxide groups (comprising at least one saturated carbon-heteroatom bond).

Preferred first type of ligands comprise oleylamine, allylamine, acrylamide, undecylenic acid, undecanoic acid, myristoleic acid, palmitoleic acid, linoleic acid, oleic acid, ricinoleic acid, undecenoate, oleate and ricinoleate.

A particular preferred example of a first type of ligands comprises oleylamine.

The first type of ligands may optionally comprise one or more further functional group(s) in addition to the first functional group(s), for example one or more second functional group(s) and/or one or more third functional group(s) and/or one or more fourth functional group(s).

In preferred methods according to the present invention, the quantum dots of step a) are provided with more than one type of ligands, for example provided with at least a first type of ligands and with a further type of ligands, for example provided with a second type of ligands, a third type of ligands and/or a fourth type of ligands.

In case the quantum dots are provided with further type(s) of ligands, for example second type of ligands and/or third type of ligands, the first functional group of the multifunctional compound may while binding to the outer surface of the quantum dots, displace part of the first type of ligands from the outer surface and/or part of the further type of ligands, for example part of the second type of ligands and/or part of the third type of ligands.

The further type of ligands comprise for example halides, carboxylates, for example unsaturated carboxylates.

Examples of halides comprise metal fluorides, metal chlorides, metal bromides or metal iodides. Preferred examples comprise zinc fluoride, zinc chloride, zinc bromide and zinc iodide.

Examples of carboxylates comprise metal carboxylates as for example zinc carboxylates. Preferred examples comprise zinc neodecanoate, zinc laurate, zinc myristate, zinc pentadecanoate, zinc palmitate and zinc stearate.

Unsaturated carboxylates are carboxylates comprising one or more carbon-carbon double bond. Examples of unsaturated carboxylates comprise unsaturated metal carboxylates for example unsaturated zinc carboxylate. Preferred examples comprise zinc undecylenate, zinc linoleate, zinc oleate and zinc ricinoleate.

The multifunctional compound comprises at least one first functional group and at least one second functional group. The multifunctional compound comprises for example a plurality of first functional groups and/or a plurality of second functional groups. The multifunctional compound may optionally comprise one or more further functional group(s), for example one or more third functional group(s) and/or one or more fourth functional group(s).

As first functional group of the multifunctional compound any functional group that is able to bind to the outer surface of the quantum dots can be considered. Preferred first functional groups of the multifunctional compounds are able to bind to the outer surface of a quantum dot thereby possibly displacing the first type of ligands and/or any further type of ligands.

As second functional group of the multifunctional compound any functional group that is able to interact with the at least one first functional group of the first type of ligands can be considered. Preferably, the second functional group of the multifunctional compound is able to cross-link with the at least one first functional group of the first type of ligands.

Preferred multifunctional compounds comprise polythiols. Polythiols refer to compounds having two or more thiol groups in one molecule thereof and comprise compounds of polythiol of formula $R(SH)_y$, with $y \geq 2$ and preferably with $y > 2$.

The number of thiol groups per molecule is preferably larger than 2, for example ranging between 2 and 7, for example 3 or 4.

The thiol groups of the polythiol may be primary or secondary thiols. Primary thiols are preferred.

Examples of suitable polythiols include but are not limited to aliphatic polythiols, cycloaliphatic polythiols, aromatic polythiols, heterocyclic polythiols, polymeric polythiols and mixtures thereof.

Non-limiting examples of suitable polythiols include 2,5-dimercaptomethyl-1,4-dithiane, 2,2'-thiodiethanethiol, pentaerythritol tetrakis(3-mercaptopropionate), pentaerithrytol tetrakis(3-mercaptobutylate, pentaerythritol tetrakis(2-mercaptoacetate), pentaerythritol tetrakis(thioglycolate), trimethylolpropane tris(3-mercaptopropionate), trimethylolpropane tris(2-mercaptoacetate), 4-mercaptomethyl-3,6-dithia-1,8-octanedithiol, 4-tert-butyl-1,2-benzenedithiol, 4,4'-thiodibenzenethiol, 1,2-benzenedithiol, 1,3-benzenedithiol, benzene-1,4-dithiol, ethylene glycol bis(mercaptoacetate), ethylene glycol bis(3-mercaptopropionate), ethylene glycol bis(thioglycolate), trimethylolpropane tris(thioglycolate), dipentaerythritol hexakis(3-mercaptopropionate), trimethylolpropane tris(3-mercaptopropionate), 1,4-bis3-mercaptobutylyloxy butane, tris[2-(3-mercaptopropionyloxy)ethyl] isocyanurate, trimethylolpropane tris(mercaptoacetate), 2,4-bis(mercaptomethyl)-1,3,5,-triazine-2,4-dithiol, 2,3-di(2-mercaptoethyl)thio)-1-propanethiol, dimercaptodiethylsufide, ethoxylated trimethylpropan-tri(3-mercaptopropionate and polycaprolactone tetra (3-mercaptopropionate), 1,3,5-tris(2-(3-sulfanylbutanoyloxy)ethyl)-1,3,5-triazinane-2,4,6-trione, 1,4-bis(3-mercaptobutyryloxy) butane and mixtures thereof.

The multifunctional compound is preferably added in excess to the mixture of step b) of the above described method.

More preferably, the multifunctional compound is added to the reaction mixture of step b) in an amount to obtain a ratio of the second functional group of the multifunctional compound to the first functional group of the first type of ligands ranging between 1:1 and 2:1.

In preferred embodiments, the at least one first functional group of the first type of ligands comprises a first click functional group and the second functional group of the multifunctional compound comprises a second click functional group capable to react with the first click functional group by a click reaction.

The first click functional group (the first functional group of the first type of ligands) preferably comprises at least one unsaturated bond, for example at least one unsaturated carbon-carbon bond as for example a carbon-carbon double bond or a carbon-carbon triple bond, at least one unsaturated carbon-heteroatom bond as for example a carbonyl or nitrile group, at least one saturated carbon-heteroatom bond as for example an epoxide group, at least one azide functional group or at least one thiol functional group.

The second click functional group (the second functional group of the multifunctional compound) comprises for example at least one unsaturated carbon-carbon bonds as for example a carbon-carbon double bond (for example an acrylate functional group, a methacrylate functional group, an acrylamide functional group or an acrylonitrile functional group) or a carbon-carbon triple bond, at least one unsaturated carbon heteroatom bond as for example a carbonyl or nitrile group, at least one saturated carbon-heteroatom bond as for example an epoxide functional group, at least one azide functional group or at least one thiol functional group.

Typical click reactions comprise, Diels-Alder reactions, azide-alkyne cycloaddition reactions, alkyne-nitrone cycloaddition reactions, alkene-azide cycloaddition reactions, alkene-tetrazole cycloaddition reactions, azide-nitrile cycloaddition reactions, tetrazole-alkene cycloaddition reactions, thiol-ene (radical addition) reactions, thiol-yne (radical addition) reactions, thiol-Michael (Michael addition) reactions, thiol-isocyanate (carbonyl addition) reactions, thiol-epoxy ($S_N2$ ring opening) reactions, thiol-halogen and thiol-disulfide ($S_N2$ nucleophilic substitution) reactions or an addition reaction between two unsaturated carbon-carbon bonds, as for example between an alkene and an acrylate functional group or between two acrylate functional groups. Particularly preferred click reactions comprise azide-alkyne cycloaddition reactions, thiol-ene reactions, thiol-yne reactions, thiol-isocyanate reactions and thiol-epoxy reactions.

During the curing step c), an interaction between the at least one second functional group of the at least one multifunctional compound and the at least one first functional group of the first type of ligands provided on the outer surface of the quantum dots is established. Preferably, said interaction is a cross-link. More preferably, the curing step c) involves a click reaction between the first click functional group and the second click functional group. The click reaction can be catalysed or initiated, by using a catalyst or by applying heat, pressure or radiation, for example UV light. Optionally, a curing agent, for example a UV curing agent, a thermal curing agent or a catalyst can be added to the reaction mixture.

In a preferred method according to the present invention, the reaction mixture of step b) does not comprise a polymerization compound, and the curing step c) does not comprise adding a polymerisation compound.

A preferred method according to the present invention further comprises the step of adding a polymerisation compound to the (cured) reaction mixture obtained at the end of step c). Such preferred method comprises the steps of
  a) providing quantum dots having an outer surface, the quantum dots are provided with at least a first type of ligands bonded to the outer surface of the quantum dots and optionally provided with at least a further type of ligands bonded to the outer surface of the quantum dots. The first type of ligands comprises at least one first functional group. Preferably, the at least one first functional group of the first type of ligands remains available once the first type of ligands is bonded to the outer surface of the quantum dots;
  b) providing a reaction mixture by dispersing the quantum dots of step a) in a solvent comprising at least one multifunctional compound. The at least one multifunctional compound comprises at least one first functional group and at least one second functional group. Optionally, the at least one multifunctional compound comprises a further functional group or further functional groups, for example at least a third functional group and/or at least a fourth functional group. The at least one first functional group of the at least one multifunctional compound is able to bind to the outer surface of the quantum dots and the at least one second functional group of the at least one multifunctional compound is able to interact, preferably to cross-link, with the at least one first functional group of the first type of ligands provided on the outer surface of the quantum dots;

c) curing said reaction mixture of step b),
d) adding at least one polymerisation compound to the cured reaction mixture obtained at the end of step c), preferably wherein the reaction mixture of step b) does not comprise a polymerization compound, and the curing step c) does not comprise adding a polymerisation compound.

Preferably, the method comprises a purification step, for example after the partial exchange of the first type of ligands and the multifunctional compound and/or after the partial exchange of the further type of ligands in step b).

The at least one polymerisation compound is preferably added to the reaction mixture after the addition of the multifunctional compound once the multifunctional compound is bonded to the outer surface of the quantum dots and/or once the first functional group of the first type of ligands has interacted, for example cross-linked, with the second functional group of the multifunctional compound. Preferably, first the multifunctional compound is added to the reaction mixture and subsequently the at least one polymerisation compound is added to the reaction mixture once the multifunctional compound is bonded to the outer surface of the quantum dots and/or once the first functional group of the first type of ligands has interacted, for example cross-linked, with the second functional group of the multifunctional compound. More preferably, the at least one polymerisation compound is added to the (cured) reaction mixture after the curing step c).

Preferably, the solvent is removed from the reaction mixture before the polymerisation compound is added to the reaction mixture. The solvent can be removed by any technique known in the art.

Preferably, the reaction mixture is stirred before, during and/or after the addition of the polymerisation compound to the reaction mixture.

The at least one polymerisation compound is preferably able to react with the multifunctional compound, for example with the second functional group of the multifunctional compound or with a further functional group of the multifunctional compound, for example with a third functional group and/or with a fourth functional group of the polymerisation compound. Preferably, the polymerisation compound is able to cross-link with the multifunctional compound.

In case the multifunctional compound comprises a polythiol, the polymerisation compound preferably comprises a compound able to react, preferably to cross-link, with a thiol functional group. Thiol functional groups can for example react with electron rich enes or alkynes, with electron poor enes, isocyanates, epoxies and halogens. Examples of free-radical reactions involve thiol-ene and thol-yne reactions. Examples of carbonyl additions reaction comprise thiol-isocyanate reactions. Example of $S_N2$ nucleophilic ring opening reactions comprise thiol-epoxy reactions. Examples of $S_N2$ nucleophilic substitutions comprise thiol-halogen and thiol-disulfide reactions. Examples of Michael addition reactions involve thiol-Michael reactions.

Preferred examples of polymerization compounds comprise 1,3,5,-triallyl-1,3,5-triazine-2,4,6(1H,3H,5H)-trione, 2,4,6-triallyloxy-1,3,5-triazine, pentaerythritol allyl ether, tri(ethylene glycol) divinyl ether, trimethylolpropane trimethacrylate (SR350 from Sartomer), trimethylolpropane triacrylate (SR351 from Sartomer), ethoxylated (4) bisphenol A methacrylate (SR540 from Sartomer), ethoxylated (4) bisphenol A diacrylate (SR601E from Sartomer), polyester acrylate (CN2303EU and CN2305 from Sartomer), aliphatic urethane acrylate (CN9210 from Sartomer), epoxy acrylate (CN132 from Sartomer), poly[(phenyl glycidyl ether)-co-formaldehyde], 2-isocyanatoethyl methacrylate, 2-(2-methacryloyloxy ethyl oxy) ethyl isocyanate, 2-(o-[1'-methylpropylideneamino]carboxyamino)ethyl methacrylate, 2-(3,5-dimethyl-1H-pyrazole-1-carboxamido)ethyl methacrylate, 2-isocyanatoethyl acrylate and 1,1-bis(acryloyloxymethyl) ethyl isocyanate.

Possibly, the polymerisation of the polymerisation compound is initiated for example by heat, pressure and/or radiation, for example UV light or by using a catalyst. Optionally, a curing agent, for example a UV curing agent, a thermal curing agent or a base catalyst can be added to the reaction mixture.

The polymerisation compound is preferably added to the reaction mixture of step b) in an amount to obtain a ratio of the further functional group of the multifunctional compound, for example the second functional group of the multifunctional compound to the functional group of the polymerisation compound able to react with the functional group ranging between 1:1 and 2:1.

Optionally additives such as dispersing agents and/or wetting agents can be added. Dispersing agents can for example be added to prevent or avoid particle flocculation that may reduce the (ink) viscosity. Wetting agents can be added to improve the wetting behaviour during coating.

In the context of this application, "providing a reaction mixture by dispersing the quantum dots of step a) in a solvent comprising at least one multifunctional compound" should not be interpreted narrowly, and may also mean that said reaction mixture is obtained by dispersing the quantum dots of step a) in a solvent, after which the at least one multifunctional compound is added.

In a preferred method according to the present invention step b) the steps of b1) dispersing said quantum dots in an anhydrous solvent to form dispersed quantum dots, and b2) adding said multifunctional compound to said dispersed quantum dots to form said reaction mixture. The anhydrous solvent is preferably anhydrous toluene.

According to a second aspect of the present invention surface stabilized quantum dots are provided. The surface stabilized quantum dots are preferably obtainable by the above described method. The surface stabilized quantum dots have an outer surface and are provided with at least one first type of ligands bonded to the outer surface of the quantum dots. The surface stabilized quantum dots are further provided with at least one multifunctional compound bonded to the outer surface of the quantum dots. The multifunctional compound and the first type of ligands have interacted, i.e. a functional group of the multifunctional compound has interacted with a functional group of the first type of ligands. Preferably, the multifunctional compound and the first type of ligands are cross-linked, i.e. a functional group of the multifunctional compound is cross-linked with a functional group of the first type of ligands.

The degree of cross-linking is preferably at least 40% and more preferably at least 50%, at least 60%, at least 70%, at least 80% or at least 90%.

The degree of cross-linking is defined as the ratio of the number of interactions between the second functional groups of the multifunctional compound and the first functional groups of the first type of ligands and the initial number of first functional groups, i.e. the total number of first functional groups of the first type of ligands of the quantum dots before interaction with the second functional groups of the multifunctional compound. Preferably, the degree of cross-linking corresponds to the ratio of the number of cross-links between the second functional groups of the multifunctional compound and the first functional groups of the first type of ligands and the initial number of first functional groups, i.e. the total number of first functional groups of the first type of ligands of the quantum dots before cross-linking with the second functional group of the multifunctional compound. Preferably, the degree of cross-linking is determined at the end of the curing step c).

The degree of cross-linking can be determined by NMR spectroscopy.

According to a third aspect of the present invention an article comprising encapsulated or embedded quantum dots, i.e. encapsulated or embedded surface stabilized quantum dots is provided. The article comprising encapsulated or embedded quantum dots is for example obtained by adding a polymerisation compound as described above to a reaction mixture comprising the quantum dots and the multifunctional compound followed by polymerisation.

According to a fourth aspect of the present invention the use of surface stabilized quantum dots as described above as luminescence color converter is provided. As the surface stabilized quantum dots have a good photothermal stability, they are suitable as on chip color convertor, for example to be used in LED applications, mini-LED applications and micro-LED applications.

According to a fifth aspect of the present invention the use of an article comprising encapsulated quantum dots, in particular encapsulated surface stabilized quantum dots, as luminescent color converter is provided. As the encapsulated surface stabilized quantum dots have a good photothermal stability, they are suitable for on chip applications and are suitable for LED applications, mini-LED applications and micro-LED applications.

BRIEF DESCRIPTION OF THE DRAWINGS

The present invention will be discussed in more detail below, with reference to the attached drawings, in which.

DESCRIPTION OF EMBODIMENTS

Figures 1A, 1B, 1C:
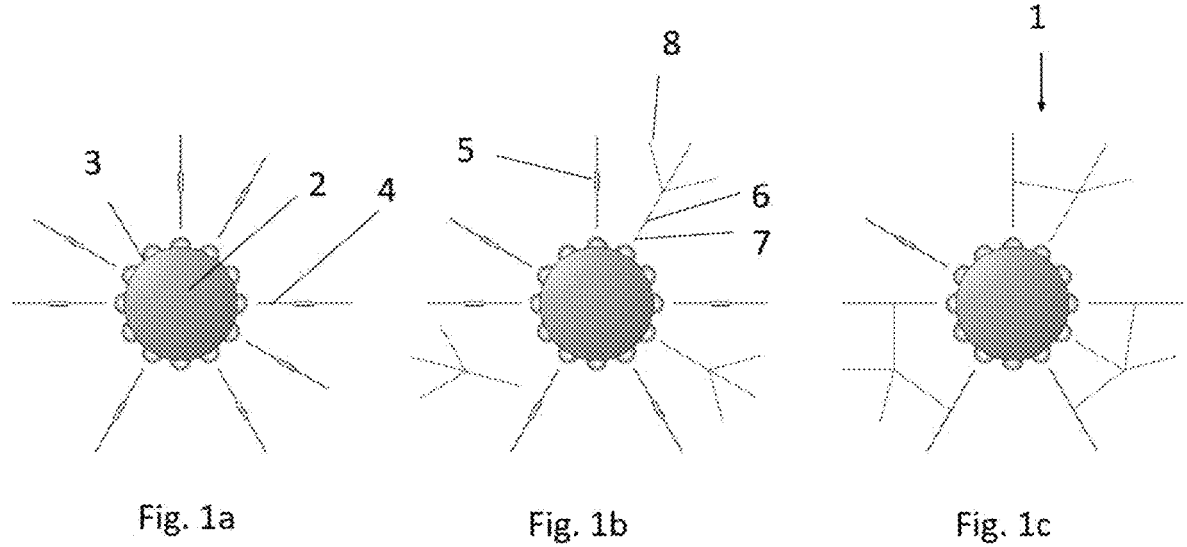
FIG. 1 is a schematic illustration of the method to prepare a surface stabilized quantum dot according to the present invention.

The present invention will be described with respect to particular embodiments and with reference to certain drawings but the invention is not limited thereto but only by the claims.

The drawings are only schematic and non-limiting. The size of some elements may be exaggerated and not drawn on scale for illustrative purposes. The dimensions and the relative dimensions do not correspond to actual reductions to practice of the invention.

When referring to the endpoints of a range, the endpoints values of the range are included.

When describing the invention, the terms used are construed in accordance with the following definitions, unless indicated otherwise.

The terms 'first', 'second' and the like used in the description as well as in the claims, are used to distinguish between similar elements and not necessarily describe a sequence, either temporally, spatially, in ranking or in any other manner. It is to be understood that the terms so used are interchangeable under appropriate circumstances and that the embodiments of the invention described herein are capable of operation in other sequences than described or illustrated herein.

The term 'and/or' when listing two or more items, means that any one of the listed items can by employed by itself or that any combination of two or more of the listed items can be employed.

The term "quantum dot" (QD) or "semiconductor nanocrystal" refers to nanometer-sized particles that exhibit size-dependent optical and electronic properties. Nanometer-sized particles include all types of particles having at least one of their dimensions, for example diameter, length, width or thickness in the nanometer scale and include crystalline or amorphous nanoparticles, nanocrystals, quantum dots, quantum rods, tetrapods, nanotubes, nanospheres, nanodisc, etc. Nanometer-sized particles are not limited to any particular shape, and may include spherical as well as non-spherical particles.

Quantum dots comprise nanocrystals that have a homogeneous or substantially homogenous composition, for example a core as well as nanocrystals that are heterogeneous as for example core/shell quantum dots comprising a core and one or more shells surrounding the core. The shell is defined as the material surrounding the core and may comprise one or more shell layers.

The core comprises for example a group III-V material, for example a binary, ternary or quaternary group III-V material for example comprising Ga and/or In as group III element and comprising N, P, As and/or Sb as group V element. Preferred core materials comprise InP, InAs, InSb, GaAs, InGaP, InGaAs, InZnP, InGaP, InAsSb and InAsP.

The shell material comprises for example a group II-VI material, for example a binary, ternary or quaternary group II-VI material for example comprising Zn or Cd as group II(B) element and comprising O, S, Se and/or Te as group VI(A) element. Preferred shell materials comprise ZnSe, ZnS, ZnTe, ZnSSe, ZnCdSe and ZnSeTe.

Preferred examples of the core/shell quantum dots comprise InP/ZnSe quantum dots, InP/ZnS quantum dots, InP/ZnSe/ZnS quantum dots, InP/ZnS/ZnSe quantum dots, InP/XY whereby X comprises Cd, Zn and Y comprises S, Se, Te and combinations thereof as for example $InP/Cd_xZn_{1-x}Se$ or $InP/ZnTe_xSe_{1-x}$.

The term "ligand" refers to any molecule or ion capable of interacting, either weakly or strongly, with a quantum dot for example through covalent interaction, ionic interaction, Van der Waals interaction or by any other molecule interaction with the outer surface of the quantum dot.

For the purpose of this invention the term solvent refers to coordinating solvents as well as to non-coordinating solvents. Where in embodiments and/or claims of the present application reference is made to a coordinating solvent, reference is made to a substance that acts both as solvent for the chemical reactions and as stabilizing agent for the nanoparticles formed. Some examples of coordinating solvents are oleyamine (OLA), trioctylphosphine oxide (TOPO) and oleic acid (OA). Non-coordinating solvents refer to substances that only act as solvent for the chemical reaction. Some examples of non-coordinating solvents are octadecene and hexadecane.

"Click chemistry" refers to the chemistry whereby pairs of functional groups rapidly and selectively react ("click") with each other. The functional groups of a pair of functional groups that react selectively in such click chemistry reaction are referred to as the first click functional group and the second click functional group.

FIG. 1 illustrates the method to prepare surface stabilized quantum dots 1 according to the present invention. FIG. 1a shows a quantum dot 2 provided with a first type of ligands 4 bonded to the outer surface 3 of the quantum dot 2. The first type of ligands 4 have at least a first functional group 5, for example at least one unsaturated carbon-carbon bond. FIG. 1b shows the addition of a multifunctional compound 6. The multifunctional compound 6 is binding to the outer surface 3 of the quantum dot 2 with a first functional group 7 of the multifunctional compound 6. Part of the first type of ligands 4 is displaced and replaced with the multifunctional compound 6. The multifunctional compound 6 comprises further functional groups for example at least one second functional group 8 able to react with the first functional group 5 of the first type of ligands 4. FIG. 1c shows a surface stabilized quantum dot 1, also referred to as $S^3$dot (stitched and stable surface capped quantum dot).

Figure 2:
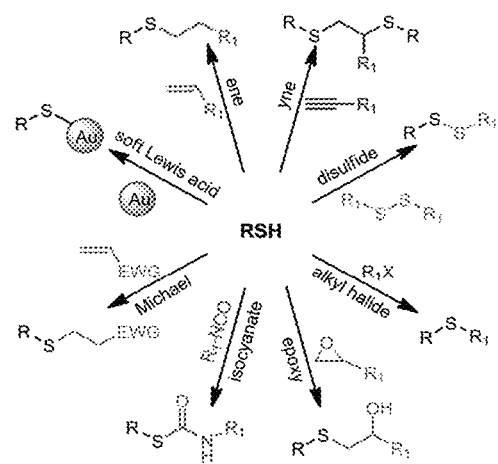
FIG. 2 illustrates different synthetic routes to prepare polythiol copolymers (Le Neindre, M. and R. Nicolaÿ (2014). "Polythiol copolymers with precise architectures: a platform for functional materials." Polymer Chemistry 5(16): 4601-4611)

Optionally, the surface stabilized quantum dots are embedded or encapsulated in a polymer material. The surface stabilized quantum dots can for example be embedded or encapsulated by adding a polymerisation compound to the reaction mixture comprising the quantum dots and the multifunctional compound followed by UV curing and/or heating or via a catalysed process. FIG. 2 (from Le Neindre, M. and R. Nicolaÿ (2014). "Polythiol copolymers with precise architectures: a platform for functional materials." Polymer Chemistry 5(16): 4601-4611) shows a number of different polymerization reactions using a polythiol as multifunctional compound. In FIG. 2 X refers to Cl, Br or I; R, refers to an aliphatic or aromatic group and EWG refers to an electron withdrawing group.

Preferred Aspects of the Invention

Embodiment 1 of aspect 1 relates to a method to prepare surface stabilized quantum dots, said method comprising the steps of a) providing quantum dots having an outer surface, said quantum dots being provided with at least a first type of ligands bonded to said outer surface of said quantum dots and optionally provided with at least one further type of ligands bonded to said outer surface of said quantum dots, said first type of ligands comprising at least one first functional group remaining available once the first type of ligands is bonded to said outer surface of said quantum dots; and b) providing a reaction mixture by dispersing said quantum dots in a solvent comprising at least one multifunctional compound, said multifunctional compound comprising at least a first functional group and at least a second functional group, said first functional group of said multifunctional compound being able to bind to said outer surface of said quantum dots and said second functional group of said multifunctional compound being able to interact, preferably to cross-link, with the at least one first functional group of said first type of ligands provided on said outer surface of said quantum dots.

Embodiment 2 of aspect 1 is according to embodiment 1 of aspect 1 and is such that said first functional group of said multifunctional compound is able to bind to said outer surface of said quantum dots thereby displacing part of said first type of ligands from said outer surface of said quantum dots.

Embodiment 3 of aspect 1 is according to embodiment 1 of aspect 1 or embodiment 2 of aspect 1 and is such that said first functional group of said first type of ligands comprises at least one unsaturated carbon-carbon bond, at least one unsaturated carbon-heteroatom bond, at least one saturated carbon-heteroatom bond or at least one thiol functional group.

Embodiment 4 of aspect 1 is according to any one of embodiments 1 to 3 of aspect 1 and is such that said further type of ligands comprises a halide, a carboxylate or an unsaturated carboxylate.

Embodiment 5 of aspect 1 is according to any one of embodiments 1 to 4 of aspect 1 and is such that said multifunctional compound comprises a polythiol.

Embodiment 6 of aspect 1 is according to any one of embodiments 1 to 5 of aspect 1 and is such that said first functional group of said first type of ligands comprises a first click functional group and said second functional group of said multifunctional compound comprises a second click functional group capable to react with said first click functional group by a click reaction.

Embodiment 7 of aspect 1 is according to any one of embodiments 1 to 6 of aspect 1 and is such that said first click functional group comprises at least one unsaturated carbon-carbon bond, at least one unsaturated carbon-heteroatom bond, at least one saturated carbon-heteroatom bond, at least one azide functional group or at least one thiol functional group.

Embodiment 8 of aspect 1 is according to any one of embodiments 1 to 7 of aspect 1 and is such that said second click functional group comprises at least one unsaturated carbon-carbon bond, at least one unsaturated carbon-heteroatom, at least one saturated carbon-heteroatom, at least one azide functional group or at least one thiol functional group.

Embodiment 9 of aspect 1 is according to any one of embodiments 1 to 8 of aspect 1 and is such that said first click functional group comprises at least one unsaturated carbon-carbon bond and said second click functional group comprises at least one thiol functional group; said first click functional group comprises at least one unsaturated carbon-carbon bond and said second click functional group comprises at least one azide functional group or said first click functional group comprises at least one thiol functional group and said second click functional group comprises at least one unsaturated carbon-carbon bond.

Embodiment 10 of aspect 1 is according to any one of embodiments 1 to 9 of aspect 1 and is such that said quantum dot comprises a core comprising a group III-V material or wherein said quantum dot comprises a core comprising a group III-V material surrounded by at least one shell comprising a group II-VI material.

Embodiment 11 of aspect 1 is according to any one of embodiments 1 to 10 of aspect 1 and is such that said method further comprises the step of d) adding at least one polymerisation compound to said reaction mixture of step b).

Embodiment 12 of aspect 1 is according to embodiment 11 of aspect 1 and is such that said at least one polymerisation compound comprises a compound able to react, preferably to cross-link, with a functional group of said multifunctional compound.

Embodiment 13 of aspect 1 is according to embodiment 11 of aspect 1 or embodiment 12 of aspect 1 and is such that said multifunctional compound comprises a polythiol and said polymerisation compound comprises a compound able to react with a thiol group of said first polymerisation compound.

Embodiment 1 of aspect 2 relates to surface stabilized quantum dots obtainable by the method as defined in any one of embodiments 1 to 13 of aspect 1, said surface stabilized quantum dots comprising quantum dots having an outer surface, said quantum dots being provided with at least a first type of ligands bonded to said outer surface of said quantum dots, said quantum dots further being provided with at least one multifunctional compound bonded to said outer surface of said quantum dots, whereby a functional group of said multifunctional compound has interacted with a functional group of said first type of ligands Embodiment 2 of aspect 2 is according to embodiment 1 of aspect 2 and is such that a functional group of said multifunctional compound and a functional group of said first type of ligands are cross-linked Embodiment 3 of aspect 2 is according to embodiment 1 of aspect 2 or embodiment 2 of aspect 2 and is such that said quantum dots comprising a core comprising a group III-V material or wherein said quantum dot comprises a core comprising a group III-V material surrounded by at least one shell comprising a group II-VI material.

Embodiment 1 of aspect 3 relates to an article comprising surface stabilized quantum dots as defined in any one of embodiments 1 to 3 of aspect 2, said quantum dots being encapsulated in a polymer material.

Embodiment 1 of aspect 4 relates to the use of surface stabilized quantum dots as defined in any one of embodiments 1 to 3 of aspect 2 or use of an article comprising surface stabilized quantum dots as defined in embodiment 1 of aspect 3 for use in on-chip color conversion applications.

Experimental Data

InP/ZnSe QDs were synthesised according to three synthesis methods referred to as Synthesis 1, Synthesis 2 and Synthesis 3. Subsequently, a multifunctional compound is added to the reaction mixture, which is stirred and/or heated to promote the binding of the multifunctional compound to the outer surface of the quantum dots and/or to promote the cross-linking with the initial surface ligands. At the end of this step, the surface stabilized QDs are formed. The multifunctional compound preferably preserves or even enhances the electronic passivation of the QD surface. In a next step a polymerization compound is added to create a composite, wherein the surface stabilized QDs are cross-linked with the surrounding resin.

Synthesis 1

50 mg (0.225 mmol) of indium(III) chloride and 150 mg of zinc(II) chloride (1.1 mmol) were mixed in 2.5 mL (7.6 mmol) of technical oleylamine (OLA). The reaction mixture was stirred and degassed at 120° C. for an hour and then heated to 190° C. under inert atmosphere. Upon reaching 190° C., a volume of 0.23 mL (0.84 mmol) of tris(diethylamino)phosphine was quickly injected in the above mixture and InP nanocrystals synthesis proceeded. The reaction occurred during 30 minutes. After the InP core formation, at 30 minutes, 1.5 mL of stoichiometric tri-n-octylphosphine selenide (TOP-Se) (2.24 M) and 450 mg of $ZnCl_2$ dissolved in 200 µL of distilled water was injected at 190° C. Then temperature was increased from 190 to 320° C. At 20 minutes the reaction was stopped and the temperature was lowered. InP/ZnSe QDs were then precipitated once in ethanol and suspended in toluene.

Synthesis 2

50 mg (0.225 mmol) of indium(III) chloride and 1.0 g of zinc(II) bromide (4.4 mmol) were mixed in 5 mL (15 mmol) of technical oleylamine. The reaction mixture was stirred and degassed at 120° C. for an hour and then heated to 230° C. under inert atmosphere. Upon reaching 230° C., a volume of 0.23 mL (0.8 mmol) of tris(diethylamino)phosphine was quickly injected in the above mixture and InP nanocrystals synthesis proceeded. The reaction occurred during 3 minutes. After the InP core formation, at 3 minutes, 1.5 mL of stoichiometric TOP-Se (2.24 M) was injected at 230° C. Then temperature was increased from 230 to 320° C. At 30 minutes the reaction was stopped and the temperature was lowered. InP/ZnSe QDs were then precipitated once in ethanol and suspended in toluene.

Synthesis 3

50 mg (0.225 mmol) of indium(III) chloride and 600 mg of zinc(II) chloride (4.4 mmol) were mixed in 5 mL (15 mmol) of technical oleylamine. The reaction mixture was stirred and degassed at 120° C. for an hour and then heated to 230° C. under inert atmosphere. Upon reaching 230° C., a volume of 0.23 mL (0.84 mmol) of tris(diethylamino) phosphine was quickly injected in the above mixture and InP nanocrystals synthesis proceeded. The reaction occurred during 3 minutes. After the InP core formation, at 3 minutes, 1.5 mL of stoichiometric TOP-Se (2.24 M) was injected at 230° C. Then temperature was increased from 230 to 320° C. At 30 minutes the reaction was stopped and the temperature was lowered. InP/ZnSe QDs were then precipitated once in ethanol and suspended in toluene.

Preparation of the Surface Stabilized Quantum Dots (For a 35 wt % Solid Loading UV Curable Ink)

Pre-purified and degassed 124 mg of InP-based QDs made using an aminophosphine-type precursor according to Synthesis 3 are redispersed in 0.2 mL of anhydrous toluene in a glovebox workstation. After stirring and obtaining a homogeneous dispersion, an excess of 0.2 mL (0.26 g) of the thiol polymer precursor pentaerythritol tetrakis(3-mercaptopropionate) (PETMP) is subsequently added. The mixture is vigorously stirred in order to promote a partial oleylamine/halide to thiol ligand exchange reaction. After the ligand exchange process, the QDs are precipitated using 0.5 mL of anhydrous acetone as an anti-solvent and then redispersed in 0.2 mL of anhydrous toluene. Thereafter, 131 µL (0.168 g) of the thiol polymer precursor pentaerythritol tetrakis(3-mercaptopropionate) (PETMP) is added as the multifunctional compound. After stirring and obtaining a homogeneous dispersion, the mixture is put 1 hour under vacuum to remove toluene. The mixture is subsequently put 4 hours in ultrasonic bath at 60° C. and then exposed during 2 minutes to UV curing light (15 mW/cm$^2$) such as to initiate the cross-linking reaction between the thiol polymer precursor and the remaining oleylamine ligand, to form surface stabilized quantum dots referred to as surface stabilized quantum dots or OLA-PETMP capped surface stabilized quantum dots. The cross-linking reaction is preferably done under initiator-free conditions.

Preparation of UV Curable Ink With 35 wt % Solid Loading of Surface Stabilized Quantum Dots With 2:1 Thiol to Ene Functional Groups Ratio To produce the UV curable surface stabilized quantum dot inks, 49 µL (0.057 g) of 1,3,5-triallyl-1,3,5-triazine-2,4,6 (1H,3H,5H)-trione (TTT) (polymerization compound) and 3.6 mg (1 wt %) of 2,2-dimethoxy-2-phenylacetophenone (DMPA) (photoinitiator) are added to the prepared OLA-PETMP capped surface stabilized quantum dots (see above) and vigorously mixed.

Preparation of Thermally-Curable Ink With 35 wt % Solid Loading of Surface Stabilized Quantum Dots With 2:1 Thiol to Epoxy Functional Groups Ratio The preparation follows the same protocol as mentioned in the last example except that 131 µL of PETMP is replaced by 106 µL of PETMP and 49 µL of TTT is replaced by 71 µL of poly[(phenyl glycidyl ether)-co)formaldehyde] (2.2 epoxide groups per molecule). Thereafter, 3.9 µL (1 wt %) of the base catalyst N,N-dimethylbenzylamine is added and heat is applied to initiate the polymerization reaction.

It is clear that TTT can be replaced by other polymerization compounds in order to tune the surface stabilized quantum dot-in-polymer chemical and mechanical properties. For example, trimethylolpropane trimethacrylate (SR350 from Sartomer) can be used to improve the polymer cross-link density, and/or the chemical and/or thermal resistance. Ethoxylated (4) bisphenol A methacrylate (SR540 from Sartomer) can be used to enhance both the thermal resistance and the $T_g$ of the polymer. Low viscosity aliphatic urethane acrylate (CN9210 from Sartomer) and/or epoxy acrylate (CN132 from Sartomer) can be used to increase the gas barrier properties of the polymer.

Furthermore it is clear that any type of polymerization can be considered as for example polymerization using UV curing, thermal polymerization, a catalyst process or a combination thereof. In case thermal polymerization is considered DMPA can be replaced by a thermal curing agent.

Red-Emitting Single-Color LED Formation

To obtain a red-emitting single-color LED, 10 µL of the 35 wt % solid loading UV curable surface stabilized quantum dot inks (see above) are dropcasted onto the cup of a mid-power blue LED (~3.5 mm$^3$ fillable volume). Thereafter this LED is exposed 2 minutes under UV curing light (15 mW/cm$^2$).

Cross-Linking Treatment

The cross-linking is induced by placing the samples into ultrasonic bath for 4 h at 60° C. and subsequently under a 2 minutes UV irradiation (15 mW/cm$^2$).

NMR Analyses of Oleylamine-PETMP Blank and Oleylamine-PETMP Capped InP/ZnSe Surface Stabilized Quantum Dot Sample Sample 1. Oleylamine-PETMP Blank Oleylamine and pentaerythritol tetrakis(3-mercaptopropionate) (PETMP) were mixed under inert atmosphere. The cross-linking treatment is applied afterward. NMR analysis is performed after adding toluene-$d_8$ to the obtained product.

Sample 2. Oleylamine-PETMP Capped InP/ZnSe Surface Stabilized Quantum Dot

InP/ZnSe-OLA QDs dispersed in toluene were precipitated by addition of anhydrous ethanol. The supernatant has been discarded and a small amount of anhydrous toluene-$d_8$ was added and subsequently evaporated in order to remove ethanol trace. Then an excess of 4 mL of PETMP was directly added to the precipitate. The cross-linking treatment is applied afterward. After this treatment the mixture was precipitated with anhydrous ethanol and centrifuged. NMR analysis is performed after dissolving the obtained product in toluene-$d_8$.

NMR Spectrosopy

Nuclear magnetic resonance (NMR) spectra were recorded on a Bruker Avance II spectrometer operating at a $^1$H frequency of 500 MHz and using a TXO-Z probe. Samples were prepared by evaporating InP/ZnSe QD dispersions to dryness under a continuous nitrogen flow, redispersing the QDs in 500 µL of dry deuterated toluene and transferring the solution to an NMR tube (5 mm). Quantitative $^1$H spectra were recorded with a 20 seconds delay between scans to allow for full relaxation of all NMR signals and with the spectral width set to 16 ppm. The quantification was done by using the Digital ERETIC method in Topspin 3.5. The NOESY mixing time was set to 300 milliseconds and 2048 data points in the direct dimension for 512 data points in the indirect dimension were typically sampled, with the spectral width set to 11.5 ppm.

Figure 3:
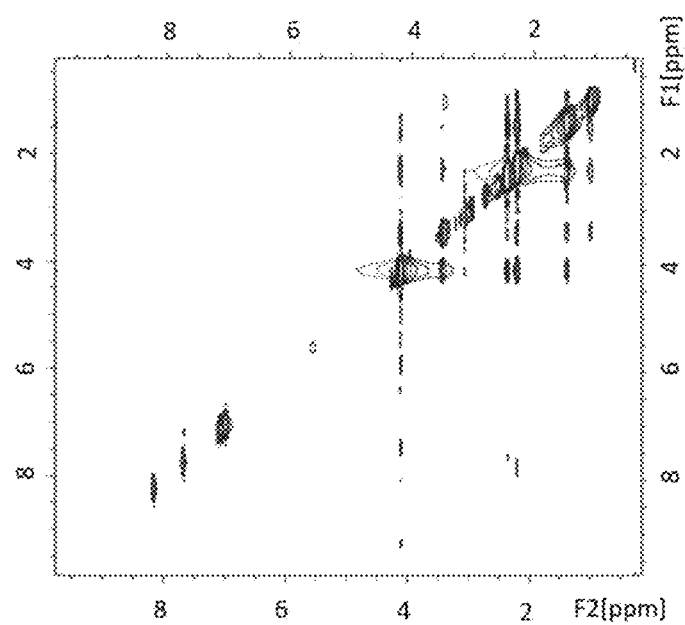
FIG. 3 shows 2D NOESY spectra of oleylamine (OLA)-pentaerythritol tetrakis(3-mercaptopropionate) (PETMP) surface stabilized quantum dots.

Pentaerythritol tetrakis(3-mercapto Propionate (PETMP) as a Surface Ligand for InP-Based QDs The Interaction of PETMP with InP-based QDs was investigated using solution 2D $^1$H NOESY (nuclear overhauser effect spectroscopy) NMR spectroscopy (see FIG. 3). A sample of InP/ZnSe QDs made with ZnCl$_2$ (Synthesis 3) was exposed to PETMP. As shown in FIG. 3, the free PETMP ligands show negative nOe cross-peaks, which is pointing towards interaction of PETMP with the QD surface.

Figure 4:
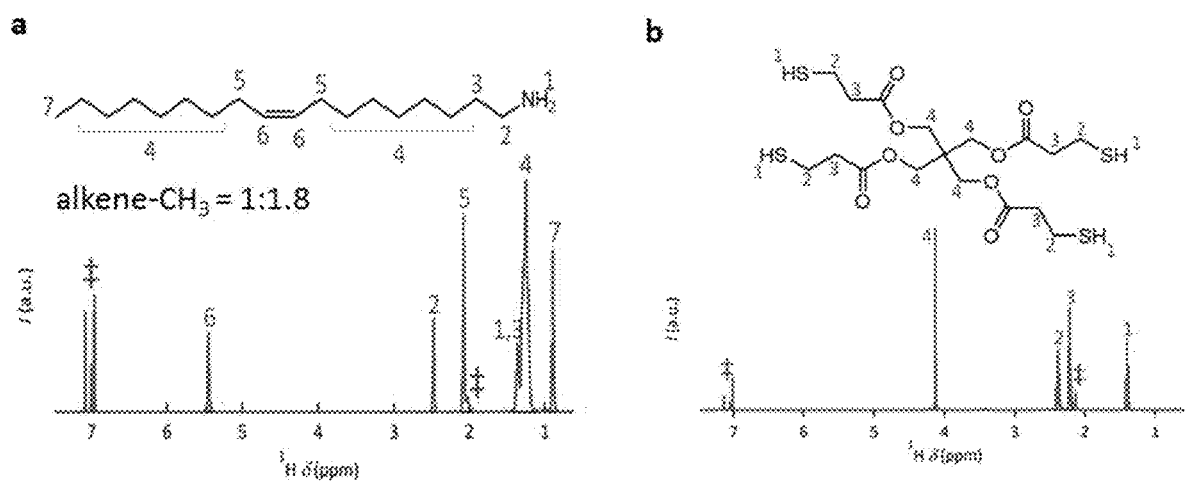
FIG. 4 shows the 1D $^1$H NMR spectrum of OLA (FIG. 4a) and PETMP (FIG. 4b)

Formation of Surface Stabilized Quantum Dots by a Oleylamine-PETMP Cross-Linking The thiol-ene reaction between PETMP (thiol) and oleylamine (OLA) (a primary amine with a C18 alkene) can be monitored by solution NMR. FIG. 4 shows the 1D $^1$H NMR spectrum of OLA (FIG. 4a) and PETMP (FIG. 4b). The thiol-ene reaction between PETMP (thiol) and oleylamine (OLA) leads to the disappearance of the characteristic alkene resonance of OLA at 5.5 ppm (resonance 6 in FIG. 4a), whereas for example the resonance of the final CH$_3$ of the OLA alkene chain at around 0.9 ppm (resonance 7 in FIG. 4a) will be unaffected. In the reference OLA spectrum shown in FIG. 4a, the ratio between the integrated intensity of the alkene and the CH$_3$ resonance amounts to 1:1.8, close to the 2:3 ratio expected from the number of protons in each group. In FIG. 4b the 1D $^1$H NMR spectrum of PETMP is shown. It can be seen that the alkene and CH$_3$ groups peaks do not overlap with the different resonances of PETMP. Hence, even in mixtures of both components, a reliable quantification of the ratio of the alkene and the methyl resonance of OLA will be possible.

Figure 5:
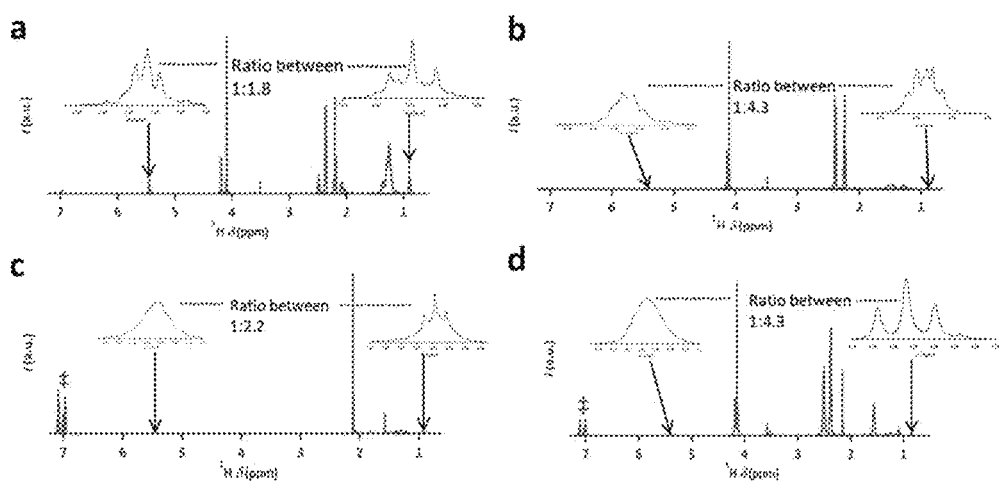
FIG. 5 shows the 1D $^1$H NMR spectrum of OLA-PETMP blank sample before the cross-linking treatment (FIG. 5a) and after (FIG. 5b) the cross-linking treatment and the 1D $^1$H NMR spectrum of an OLA-PETMP surface stabilized quantum dots sample according to the present invention before the cross-linking treatment (FIG. 5c) and after (FIG. 5d) the cross-linking treatment.

FIG. 5 shows the 1D $^1$H NMR spectrum of OLA-PETMP blank sample before the cross-linking treatment (FIG. 5a) and after (FIG. 5b) the cross-linking treatment and the 1D $^1$H NMR spectrum of OLA-PETMP surface stabilized quantum dots sample according to the present invention before the cross-linking treatment (FIG. 5c) and after (FIG. 5d) the cross-linking treatment.

From FIG. 5a a ratio alkene:$CH_3$ of 1:1.8 was observed, corresponding to the ratio obtained for pure OLA. After cross-linking by UV exposure, the ratio alkene:$CH_3$ increases to 1:4.3 (see FIG. 5b), which indicates the loss of alkene groups induced by the thiol-ene reaction.

Using a similar approach, FIG. 5c shows the 1D $^1$H NMR spectrum of a mixture of Synthesis 3 InP/ZnSe QDs and PETMP, where the resonances of PETMP and OLA can again be discerned. In this case, the ratio alkene:$CH_3$ is estimated at 1:2.2. This ratio is slightly smaller than in the case of free OLA, possibly due to the broadening of the alkene resonance of bound OLA. Also in this case, the cross-linking treatment decreases this ratio to 1:4.3 (see FIG. 5c), which again reflects the loss of alkene groups due to thiol-ene reactions. Given the fact that PETMP can bind itself to the Synthesis 3 InP/ZnSe surface, this cross-linking can lead to (a) PETMP linking two or more OLA chains, (b) PETMP linking one or more OLA chains with the InP/ZnSe surface and (c) PETMP adding to one OLA chain while leaving unreacted thiol groups available. Such cross-linking provides the surface capping of a surface stabilized quantum dot according to the present invention.

Exchange of Zinc Halides ($ZnCl_2$) and Zinc Carboxylate

Figure 6:
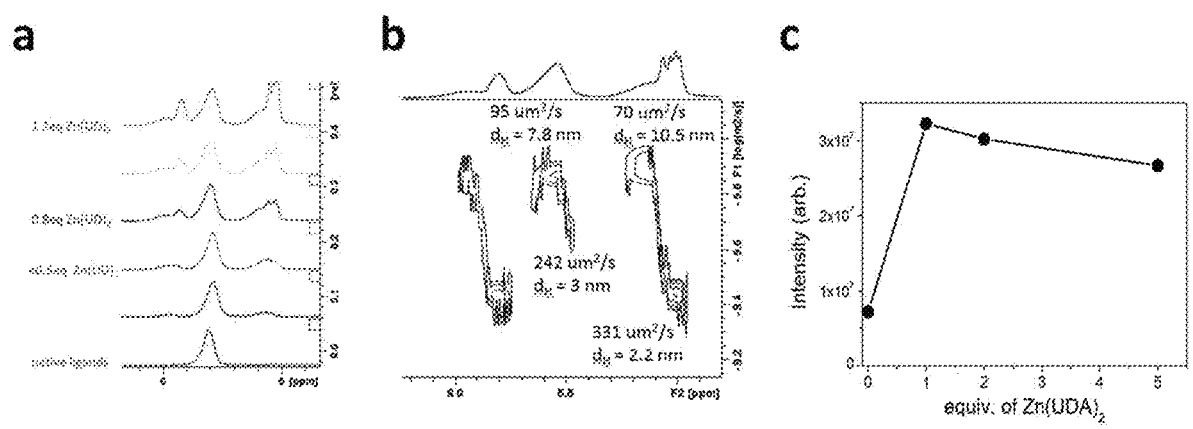
FIG. 6a shows 1D $^1$H NMR of InP/ZnSe-OLA QDs before and after injection of several equivalent of zinc undecenoate.
FIG. 6b shows the DOSY spectrum of InP/ZnSe-OLA after the injection of 1.3 equivalent of zinc undecenoate.
FIG. 6c shows the photoluminescence of InP/ZnSe-OLA after the injection of different equivalent of zinc undecenoate.

FIG. 6a shows the 1D $^1$H NMR spectra of InP/ZnSe QDs synthesized according to Synthesis 3 before and after addition of zinc undecenoate (Zn-$UDA_2$). It can be seen that addition of Zn-$UDA_2$ leads to two sets of additional alkene resonances, both comprising a broad and a more narrow resonance, at around 5.8 and 5.1 ppm. According to the DOSY spectrum (see FIG. 6b), the broadest resonances have a solvodynamic diameter of 8-10 nm, which is consistent with Zn-$UDA_2$ bound to the InP/ZnSe QDs surface. The more narrow resonances have a solvodynamic diameter of 2-3 nm, which corresponds most likely to a pool of Zn-$UDA_2$ in rapid exchange between a free and a bound state. Interestingly, FIG. 6c shows the result of an experiment where the photoluminescence intensity of an initial batch of InP/ZnSe QDs synthesized according to Synthesis 3 was measured after successive additions of Zn-$UDA_2$. It can be seen that Zn-$UDA_2$ addition significantly enhances the photoluminescence efficiency, which is probably linked to a better surface passivation. From FIG. 6 it can be concluded that zinc carboxylate such as Zn-$UDA_2$ can bind to the surface of the InP/ZnSe QDs, and in doing so may passivate electronic trap states at the ZnSe outer surface. Interestingly, InP/ZnSe QDs enriched in zinc carboxylates containing alkene functionalities—such as zinc oleate or zinc undecenoate—can be used as a starting point to form surface stabilized quantum dots, similar to above described surface stabilized quantum dots.

Stability of On-Chip QD-LEDs Based on Surface Stabilized Quantum Dots-in-Resin Composites Color conversion of QDs absorbing light of a blue LED and re-emitting light at a different wavelength is known in the art. Resins comprising QDs presently known in the art are not suitable for on-chip applications because of the exposure to high fluxes that is intrinsic to such on-chip configurations and the high photothermal stability that is required.

Figure 7:
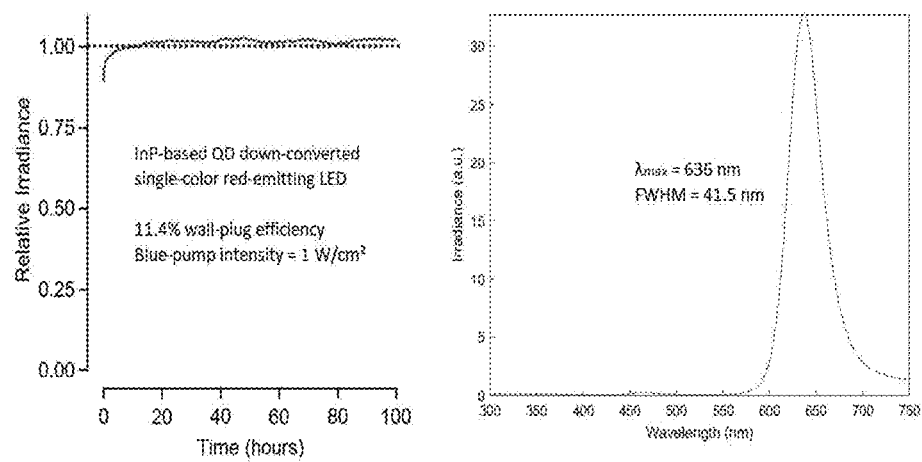
FIG. 7a shows the relative irradiance during 200 hours continuous operation at 1 W/cm$^2$ blue-pumping light intensity of a single-color red-emitting LED made of InP-based surface stabilized quantum dots in thiol-based polymer and FIG. 7b shows the corresponding LED output spectrum.

FIG. 7a shows the relative irradiance during 200 hours continuous operation at 1 W/cm$^2$ blue-pumping light intensity of a red-emitting single color LED obtained by drop casting a UV curable ink made of InP-based surface stabilized quantum dots in the LED package (~3.5 mm$^3$ fillable volume) of a blue mid-power LED (see Experimental Data). As shown in FIG. 7b, the thus prepared QD-LED has a narrow emission spectrum centered around 636 nm (red light) which completely dominates the original emission of the blue LED. Moreover, during 200 hours of operation under a blue light irradiance of 1 W/cm$^2$, no reduction of the irradiance is observed. This result attests to the excellent photothermal stability of the surface stabilized quantum dots according to the present invention, which make these materials highly suited for on-chip color conversion.

Photothermal Stability Increased by Addition of zinc (oleate)$_2$

Figure 8:
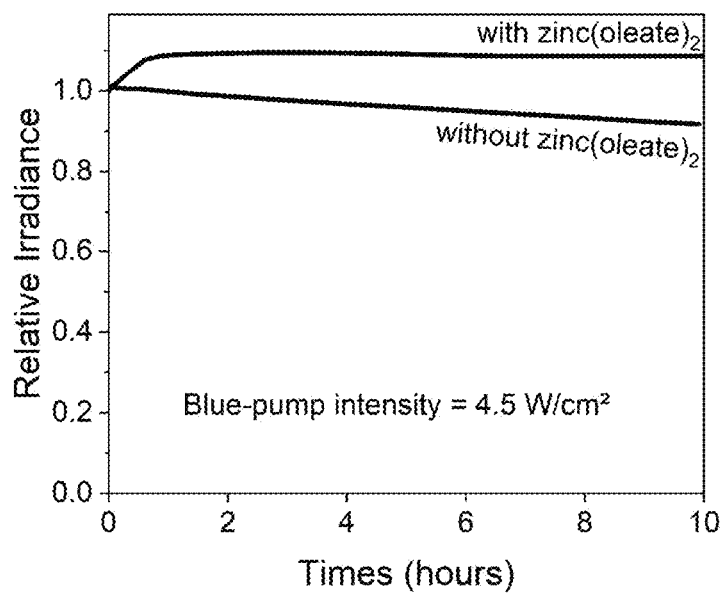
FIG. 8 shows photostability measurement of surface stabilized quantum dots composite obtained using InP/ZnSe-OLA QDs with and without a ligand exchange of the zinc halides with zinc(oleate)$_2$.

The possible exchange of zinc halides and zinc carboxylates can be used to enhance the surface passivation and to preserve or even increase the amount of cross-linking with the ligand shell combination at the InP/ZnSe-OLA QDs surface. This better surface passivation and higher degree of cross-linking allow to obtain a higher photo- and thermal stability for the obtained surface stabilized quantum dot-in-resin composite. FIG. 8 shows the photostability of surface stabilized quantum dot-in-resin composites obtained from Synthesis 3 with native ligands (OLA and $ZnCl_2$) and an surface stabilized quantum dot-in-resin composite obtained from Synthesis 3-InP/ZnSe QDs followed by an additional exposure to zinc oleate. It can be observed that the latter surface stabilized quantum dot-in-resin composite exhibits a better photothermal stability. Although the inventors do not want to be bound by any theory, it seems that zinc oleate (contains an alkene group) offers more possibility of cross-linking at the surface with PETMP.

The invention claimed is:

1. A method to prepare surface stabilized quantum dots, said method comprising the steps of
   a) providing quantum dots having an outer surface, said quantum dots being provided with at least a first type of ligands bonded to said outer surface of said quantum dots and optionally provided with at least one further type of ligands bonded to said outer surface of said quantum dots, said first type of ligands comprising at least one first functional group remaining available once the first type of ligands is bonded to said outer surface of said quantum dots;
   b) providing a reaction mixture by dispersing said quantum dots in a solvent comprising at least one multifunctional compound, said multifunctional compound comprising at least a first functional group and at least a second functional group, said first functional group of said multifunctional compound being able to bind to said outer surface of said quantum dots and said second functional group of said multifunctional compound being able to cross-link with the at least one first functional group of said first type of ligands provided on said outer surface of said quantum dots;
   c) curing said reaction mixture of step b); and
   d) adding at least one polymerisation compound to said cured reaction mixture obtained at the end of step c) wherein said at least one polymerisation compound comprises a compound able to react with a functional group of said multifunctional compound.

2. The method according to claim 1, wherein the degree of cross-linking of said first type of ligand by said multifunctional compound is at least 40% at the end of said curing.

3. The method according to claim 1, wherein said first functional group of said multifunctional compound is able to bind to said outer surface of said quantum dots thereby displacing part of said first type of ligands from said outer surface of said quantum dots.

4. The method according to claim 1, wherein said first functional group of said first type of ligands comprises at least one unsaturated carbon-carbon bond, at least one unsaturated carbon-heteroatom bond, at least one saturated carbon-heteroatom bond or at least one thiol functional group.

5. The method according to claim 1, wherein said further type of ligands comprises a halide, a carboxylate or an unsaturated carboxylate.

6. The method according to claim 1, wherein said multifunctional compound comprises a polythiol.

7. The method according to claim 1, wherein said first functional group of said first type of ligands comprises a first click functional group and said second functional group of said multifunctional compound comprises a second click functional group capable to react with said first click functional group by a click reaction.

8. The method according to claim 7, wherein said first click functional group comprises at least one unsaturated carbon-carbon bond, at least one unsaturated carbon-heteroatom bond, at least one saturated carbon-heteroatom bond, at least one azide functional group or at least one thiol functional group.

9. The method according to claim 7, wherein said second click functional group comprises at least one unsaturated carbon-carbon bond, at least one unsaturated carbon-heteroatom, at least one saturated carbon-heteroatom, at least one azide functional group or at least one thiol functional group.

10. The method according to claim 7, wherein said first click functional group comprises at least one unsaturated carbon-carbon bond and said second click functional group comprises at least one thiol functional group; said first click functional group comprises at least one unsaturated carbon-carbon bond and said second click functional group comprises at least one azide functional group or said first click functional group comprises at least one thiol functional group and said second click functional group comprises at least one unsaturated carbon-carbon bond.

11. The method according to claim 1, wherein said quantum dot comprises a core comprising a group III-V material or wherein said quantum dot comprises a core comprising a group III-V material surrounded by at least one shell comprising a group II-VI material.

12. The method according to claim 1, wherein said at least one polymerisation compound is added to the reaction mixture at the end of step c), once the multifunctional compound is bonded to the outer surface of the quantum dots and/or once the first functional group of the first type of ligands has cross-linked with the second functional group of the multifunctional compound.

13. The method according to claim 1, wherein said reaction mixture of step b) does not comprise a polymerization compound, and wherein said curing c) does not comprise adding a polymerization compound.

14. The method according to claim 1, wherein said multifunctional compound comprises a polythiol and said polymerisation compound comprises a compound able to react with a thiol group of said first polymerisation compound.

15. The method according to claim 1, wherein step b) comprises the steps of b1) dispersing said quantum dots in an anhydrous solvent to form dispersed quantum dots, and b2) adding said multifunctional compound to said dispersed quantum dots to form said reaction mixture.

* * * * *